United States Patent
Kirihara

(10) Patent No.: US 10,297,710 B2
(45) Date of Patent: May 21, 2019

(54) METHOD OF PROCESSING WAFER

(71) Applicant: DISCO CORPORATION, Tokyo (JP)

(72) Inventor: Naotoshi Kirihara, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 15/962,772

(22) Filed: Apr. 25, 2018

(65) Prior Publication Data

US 2018/0309018 A1    Oct. 25, 2018

(30) Foreign Application Priority Data

Apr. 25, 2017  (JP) ................................. 2017-086343

(51) Int. Cl.
| | | |
|---|---|---|
| *B23K 26/00* | (2014.01) | |
| *B23K 26/08* | (2014.01) | |
| *B23K 26/53* | (2014.01) | |
| *H01L 21/78* | (2006.01) | |
| *H01L 33/00* | (2010.01) | |
| *B23K 101/40* | (2006.01) | |
| *B23K 26/382* | (2014.01) | |
| *B23K 26/0622* | (2014.01) | |

(52) U.S. Cl.
CPC ........ *H01L 33/005* (2013.01); *B23K 26/0006* (2013.01); *B23K 26/0622* (2015.10); *B23K 26/083* (2013.01); *B23K 26/0869* (2013.01); *B23K 26/382* (2015.10); *B23K 26/53* (2015.10); *H01L 21/78* (2013.01); *H01L 33/0095* (2013.01); *B23K 2101/40* (2018.08)

(58) Field of Classification Search
USPC ........................................................ 438/33
See application file for complete search history.

(56) References Cited

U.S. PATENT DOCUMENTS

| | | | | |
|---|---|---|---|---|
| 8,487,208 B2* | 7/2013 | Kobayashi | ......... | B23K 26/0853 |
| | | | | 219/121.61 |
| 9,349,646 B2* | 5/2016 | Morikazu | ............... | H01L 21/78 |
| 9,517,962 B2* | 12/2016 | Takeda | ................ | C03B 33/0222 |
| 9,536,786 B2* | 1/2017 | Morikazu | ............... | H01L 21/78 |
| 9,543,466 B2* | 1/2017 | Morikazu | ........... | H01L 33/0095 |

(Continued)

FOREIGN PATENT DOCUMENTS

| | | |
|---|---|---|
| JP | 10305420 A | 11/1998 |
| JP | 2002192370 A | 7/2002 |
| JP | 2014221483 A | 11/2014 |

*Primary Examiner* — Thien F Tran
(74) *Attorney, Agent, or Firm* — Greer Burns & Crain, Ltd.

(57) ABSTRACT

A method of processing a wafer includes applying a laser beam having a wavelength that is transmittable through a sapphire substrate to the wafer while positioning a focused spot of the beam within the wafer in regions corresponding to projected dicing lines through a reverse side of the wafer, thereby forming a plurality of shield tunnels made up of a plurality of pores and an amorphous body surrounding the pores, at predetermined spaced intervals in the wafer along the projected dicing lines. A laser beam having a wavelength that is transmittable through the sapphire substrate to the wafer is applied while positioning a focused spot of the laser beam within the wafer in the projected dicing lines through the reverse side of the wafer, thereby forming modified layers between adjacent shield tunnels. Exerting external forces to the wafer divides the wafer into a plurality of optical device chips.

1 Claim, 7 Drawing Sheets

(56) References Cited

U.S. PATENT DOCUMENTS

| | | | |
|---|---|---|---|
| 2009/0124063 A1* | 5/2009 | Nakamura | B23K 26/009 438/463 |
| 2012/0111495 A1* | 5/2012 | Shimoi | B28D 5/00 156/250 |
| 2014/0213040 A1* | 7/2014 | Morikazu | H01L 21/78 438/462 |
| 2014/0256150 A1* | 9/2014 | Morikazu | H01L 21/263 438/746 |
| 2014/0334511 A1* | 11/2014 | Takeda | H01S 3/10 372/41 |
| 2017/0103921 A1* | 4/2017 | Shotokuji | H01L 21/268 |

* cited by examiner

METHOD OF PROCESSING WAFER

BACKGROUND OF THE INVENTION

Field of the Invention

The present invention relates to a method of processing a wafer, which includes a sapphire substrate and a light-emitting layer deposited on a face side of the sapphire substrate and which has optical devices disposed in respective areas on the face side that are demarcated by a grid of intersecting projected dicing lines, to divide the wafer into individual optical device chips that include the respective optical devices.

Description of the Related Art

Wafers including a sapphire substrate and a light-emitting layer (Epi layer) deposited on a face side of the sapphire substrate and having optical devices (light emitting diodes (LEDs)) disposed in respective areas on the face side that are demarcated by a grid of intersecting projected dicing lines, are divided into individual optical device chips that include the respective optical devices, and the individual optical device chips are used in lighting devices, personal computers, and mobile phones, etc. Since sapphire has a high Mohs hardness, a sapphire substrate is difficult to cut with a cutting blade. For this reason, it is customary to form division triggering points in a wafer using a laser processing apparatus.

There are different types of laser processing apparatus available for processing wafers. According to one type of laser processing apparatus, a laser beam having a wavelength that is absorbable by sapphire is applied to a wafer of sapphire along projected dicing lines thereon to perform an ablation process on the wafer, thereby dividing the wafer into individual device chips (see, for example, Japanese Patent Laid-Open No. 1998-305420). Another type of laser processing apparatus applies a laser beam having a wavelength that is transmittable through sapphire to a wafer while positioning a focused spot of the laser beam within the wafer along projected dicing lines thereon to continuously form modified layers in the wafer, thereby dividing the wafer into individual device chips (see, for example, Japanese Patent No. 3408805). According to still another type of laser processing apparatus, a laser beam having a wavelength that is transmittable through sapphire is applied to a wafer while positioning a focused spot of the laser beam within the wafer at positions corresponding to projected dicing lines on the wafer, using a condensing lens with spherical aberration in which the value calculated by dividing the numerical aperture (NA) by the refractive index (n) of the single-crystal substrate is in the range or 0.05 to 0.2, to continuously form a plurality of shield tunnels each made up of a pore and an amorphous body surrounding the pore in the wafer, thereby dividing the wafer into individual device chips (see, for example, Japanese Patent Laid-Open No. 2014-221483).

SUMMARY OF THE INVENTION

The type of laser processing apparatus that performs the ablation process is problematic in that debris tends to be scattered around, lowering the quality of the optical devices on the optical device chips. The process of continuously forming the modified layers and applying external forces to divide the wafer into individual optical device chips is disadvantageous in that though it can linearly divide the wafer along the projected dicing lines, the wafer is obliquely divided from its face side to its reverse side due to the crystal orientation of sapphire, failing to form vertical side walls on the optical device chips. If the shield tunnels are continuously formed in the wafer and then external forces are applied to divide the wafer into the individual optical device chips, then while the wafer can be vertically divided, a previously formed shield tunnel tends to scatter a subsequently applied laser beam, damaging a light-emitting layer formed on the face side of the wafer.

It is therefore an object of the present invention to provide a method of processing a wafer which is free of the problem of a reduction in the quality of optical devices on a wafer due to scattered debris produced by an ablation process, the problem of failing to form vertical side walls on optical device chips because a wafer tends to be obliquely divided from its face side to its reverse side in a process of continuously forming modified layers in the wafer and applying external forces to divide the wafer into individual optical device chips, and the problem of damaging a light-emitting layer on the face side of a wafer due to a subsequently applied laser beam scattered by a plurality of shield tunnels that are continuously formed in the wafer.

In accordance with an aspect of the present invention, there is provided a method of processing a wafer to divide the wafer into individual optical device chips, the wafer including a sapphire substrate with a light-emitting layer deposited on a face side thereof and demarcated by a grid of intersecting projected dicing lines into a plurality of areas with optical devices disposed individually therein, the method including a shield tunnel forming step of applying a pulsed laser beam having a wavelength that is transmittable through the sapphire substrate to the wafer while positioning a focused spot of the pulsed laser beam within the wafer in regions corresponding to the projected dicing lines through a reverse side of the wafer, thereby forming a plurality shield tunnels each made up of a pore and an amorphous body surrounding the pore, at predetermined spaced intervals in the wafer along the projected dicing lines, a modified layer forming step of applying a pulsed laser beam having a wavelength that is transmittable through the sapphire substrate to the wafer while positioning a focused spot of the pulsed laser beam within the wafer in the projected dicing lines through the reverse side of the wafer, thereby forming modified layers between adjacent ones of the shield tunnels, and a dividing step of exerting external forces to the wafer to divide the wafer into a plurality of optical device chips.

With the method of processing a wafer according to the present invention, vertical division triggering points from the reverse side to the face side of the wafer are formed by means of the shield tunnels, and division triggering points are also formed along the projected dicing lines by means of the modified layers formed between the shield tunnels. When the wafer is then divided into individual optical device chips, the optical device chips have side surfaces as vertical surfaces extending from the face side to the reverse side of the wafer and along the projected dicing lines.

Therefore, since no ablation process is performed, the method of processing a wafer according to the present invention is free of the problem of a reduction in the quality of optical devices on the wafer due to scattered debris produced by an ablation process. The method of processing a wafer according to the present invention is also free of the problem of failing to form vertical side walls on optical device chips because the wafer tends to be obliquely divided from its face side to its reverse side in a process of continuously forming modified layers in the wafer and applying external forces to divide the wafer into individual optical device chips, and the problem of damaging a light-emitting layer on the face side of the wafer due to a subsequently applied laser beam scattered by a plurality of shield tunnels that are continuously formed in the wafer.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1A:
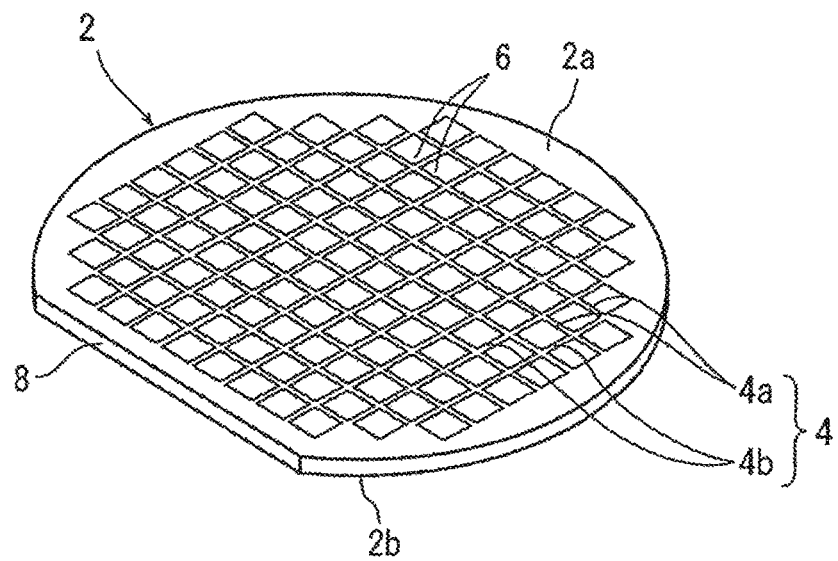
FIG. 1A is a perspective view of a wafer, depicting a face side thereof.
Figure 1B:
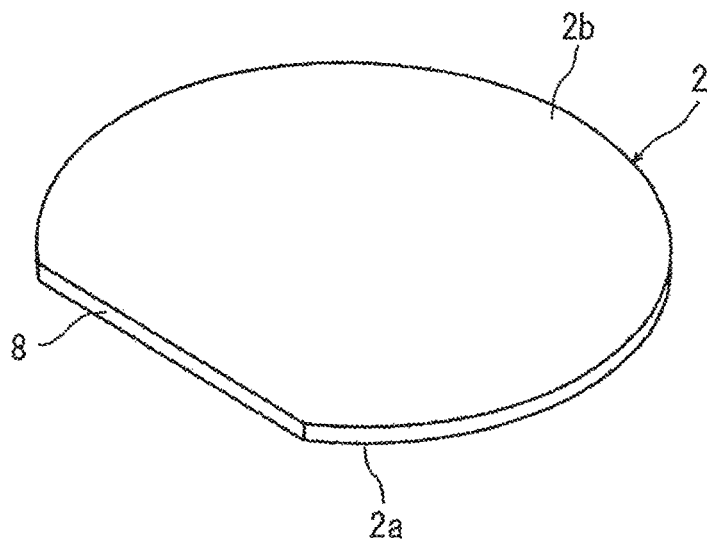
FIG. 1B is a perspective view of the wafer, depicting a reverse side thereof.

A method of processing a wafer according to an embodiment of the present invention will be described below with reference to the drawings. As depicted in FIG. 1A, a wafer 2, which is in the form of a disk-shaped sapphire ($Al_2O_3$) substrate having a thickness of approximately 500 μm, has a light-emitting layer, not depicted, deposited to a thickness of approximately 10 μm on a face side 2a thereof, i.e., a face side of the sapphire substrate, and demarcated by a grid of intersecting projected dicing lines 4 into a plurality of areas with rectangular optical devices (LEDs) 6 disposed therein. The wafer 2 includes an orientation flat 8 on its peripheral edge that is indicative of the crystal orientation of sapphire. The projected dicing lines 4 include a plurality of first projected dicing lines 4a extending parallel to the orientation flat 8 and a plurality of second projected dicing lines 4b extending perpendicularly to the orientation flat 8. FIG. 1B depicts a reverse side 2b of the wafer 2 with no optical devices 6 thereon.

Figure 2:
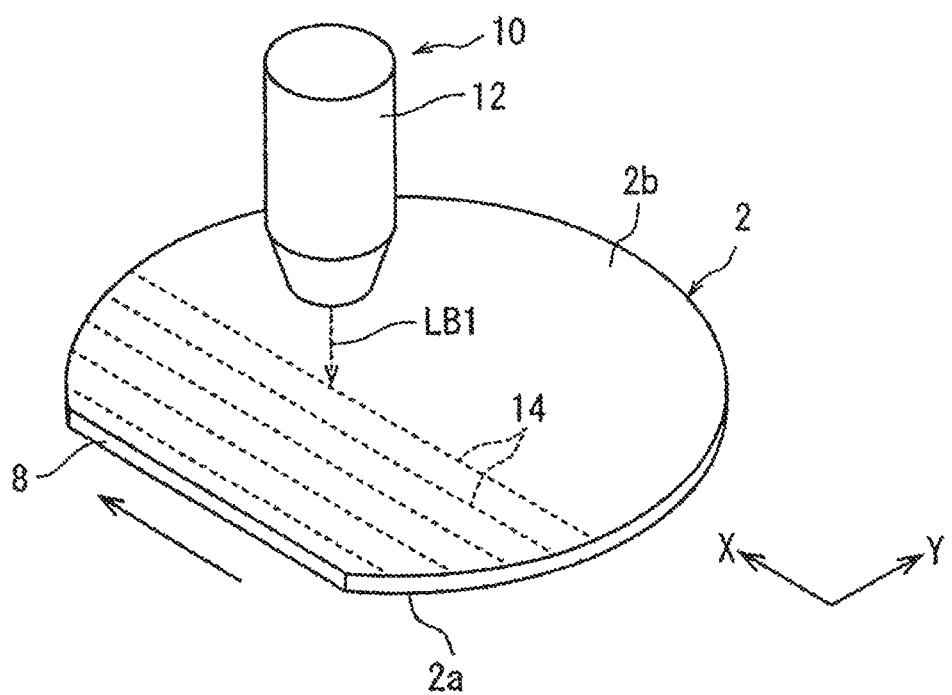
FIG. 2 is a perspective view illustrative of the manner in which a shield tunnel forming step is carried out on the wafer.

According to the present embodiment, a shield tunnel forming step is carried out on the wafer 2 to apply a laser beam having a wavelength that is transmittable through the sapphire substrate to the wafer 2 while positioning a focused spot of the laser beam within the wafer in regions corresponding to the projected dicing lines 4, thereby forming a plurality shield tunnels made up of a plurality of pores and an amorphous body surrounding the pores, at predetermined spaced intervals in the wafer 2 along the projected dicing lines 4. The shield tunnel forming step may be performed using a first laser processing apparatus 10, partly depicted in FIG. 2. As depicted in FIG. 2, the first laser processing apparatus 10 includes a chuck table, not depicted, for holding a workpiece, i.e., the wafer 2, thereon, a condenser 12 for applying a pulsed laser beam LB1 to the wafer 2 held on the chuck table, and image capturing means, not depicted, for capturing an image of the wafer 2 held on the chuck table. The chuck table, which is arranged to hold the wafer 2 under suction on its upper surface, is rotatable about a vertical axis thereof by rotating means and is movable forwards and backwards along an X direction by X-direction moving means, not depicted, and also movable forwards and backwards along a Y direction by Y-direction moving means, not depicted. The condenser 12 includes a condensing lens, not depicted, for focusing the pulsed laser beam LB1, which is oscillated by a pulsed laser oscillator, not depicted, of the first laser processing apparatus 10 and applying the focused pulsed laser beam LB1 to the wafer 2.

The condensing lens has a numerical aperture (NA) in which the value calculated by dividing the numerical aperture (NA) by the refractive index (n) of the wafer 2 is in the range of 0.05 to 0.2. According to the present embodiment, since the wafer 2 is in the form of a sapphire ($Al_2O_3$) substrate having a refractive index n of 1.7, the numerical aperture (NA) of the condensing lens is in the range of 0.085 to 0.34. Preferably, the condensing lens of the condenser 12 has a spherical aberration. The image capturing means includes an ordinary imaging device (charge-coupled device (CCD)) for capturing images of the wafer 2 with a visible light beam, infrared radiation applying means for applying an infrared radiation to the wafer 2, an optical system for capturing the infrared radiation emitted from the infrared radiation applying means, and an imaging device (infrared CCD) for outputting an electric signal representing the infrared radiation captured by the optical system, all not depicted. The X direction referred to above is a direction indicated by the arrow X in FIG. 2, whereas the Y direction referred to above is a direction indicated by the arrow Y in FIG. 2 and extending perpendicularly to the X direction. An XY plane that is defined by the X direction and the Y direction, i.e., that contains the X direction and the Y direction, lies essentially horizontally.

Continuously referring to FIG. 2, in the shield tunnel forming step, the wafer 2 with its reverse side 2b directed upwardly is attracted under suction to the upper surface of the chuck table of the first laser processing apparatus 10. Then, the image capturing means, not depicted, of the first laser processing apparatus 10 captures an image of the wafer 2 from above. Thereafter, the X-direction moving means, the Y-direction moving means, and the rotating means of the first laser processing apparatus 10 move and rotate the chuck table to adjust the orientation of the wafer 2 to a predetermined orientation and also adjust the relative position of the wafer 2 and the condenser 12 over the XY plane based on the image of the wafer 2 captured by the image capturing means. For adjusting the orientation of the wafer 2, the orientation flat 8 is aligned with the X direction, as depicted in FIG. 2, thereby aligning the first projected dicing lines 4a with the X direction and aligning the second projected dicing lines 4b with the Y direction. For adjusting the relative position of the wafer 2 and the condenser 12 over the XY plane, the condenser 12 is positioned above an end of one of the first projected dicing lines 4a aligned with the X direction. At this time, the reverse side 2b of the wafer 2 is directed upwardly and the face side 2a of the wafer 2 on which the projected dicing lines 4 are formed is directed downwardly. Since, as described above, the image capturing means includes the infrared radiation applying means, the optical system for capturing the infrared radiation, and the imaging device (infrared CCD) for outputting the electric signal representing the infrared radiation, the image capturing means is able to capture the projected dicing lines 4 on the face side 2a through the reverse side 2b of the wafer 2. Consequently, the condenser 12 can be positioned above the end of one of the first projected dicing lines 4a based on the image captured by the image capturing means.

Then, focused spot position adjusting means, not depicted, of the first laser processing apparatus 10 moves the condenser 12 along an optical axis thereof to position the focused spot of the pulsed laser beam LB1 in an area within the wafer 2 which corresponds to one of the first projected dicing lines 4a through the reverse side 2b of the wafer 2. Then, the shield tunnel forming step is performed in which while the wafer 2 and the focused spot are being relatively moved in the X direction, the condenser 12 applies the pulsed laser beam LB1, which has a wavelength that is transmittable through the sapphire substrate, to the wafer 2. According to the present embodiment, in the shield tunnel forming step, the focused spot is not moved, but the chuck table is processing-fed in the X direction at a predetermined processing-feed rate with respect to the focused spot by the X-direction moving means. Thereafter, the wafer 2 and the focused spot are relatively indexing-fed in the Y direction by a distance commensurate with each of the spaced intervals between the first projected dicing lines 4a. According to the present embodiment, in such an indexing-feed process, the focused spot is not moved, but the chuck table is indexing-fed by a distance commensurate with each of the spaced intervals between the first projected dicing lines 4a, in the Y direction with respect to the focused spot by the Y-direction moving means. The shield tunnel forming step and the indexing-feed process are alternately repeated to perform the shield tunnel forming step along all the first projected dicing lines 4a that have been aligned with the X direction. Thereafter, the rotating means rotates the chuck table through 90 degrees, and the shield tunnel forming step and an indexing-feed process for relatively indexing-feeding the wafer 2 and the focused spot in the Y direction by a distance commensurate with each of the spaced intervals between the second projected dicing lines 4b are alternately repeated to perform the shield tunnel forming step along all the second projected dicing lines 4b. The shield tunnel forming step described above may be carried out under the conditions described below, for example. In the conditions, "Defocus" refers to a distance by which the condenser 12 is moved along the optical axis thereof from a state in which the focused spot of the pulsed laser beam LB1 is positioned on the reverse face 2b of the wafer 2, and "−" added before the numerical value of the defocus means moving the condenser 12 in a negative direction along the optical axis, i.e., in the direction toward the wafer 2.

| Pulsed laser beam wavelength | 1030 nm |
|---|---|
| Pulse duration | 10 ps |
| Repetitive frequency | 10 kHz |
| Condensing lens numerical aperture (NA) | 0.25 |
| Average power output | 0.2 W |
| Defocus | −45 μm |

-continued

| Focused spot diameter | 5 μm |
|---|---|
| Processing-feed rate | 300 mm/second |

Figure 3A:
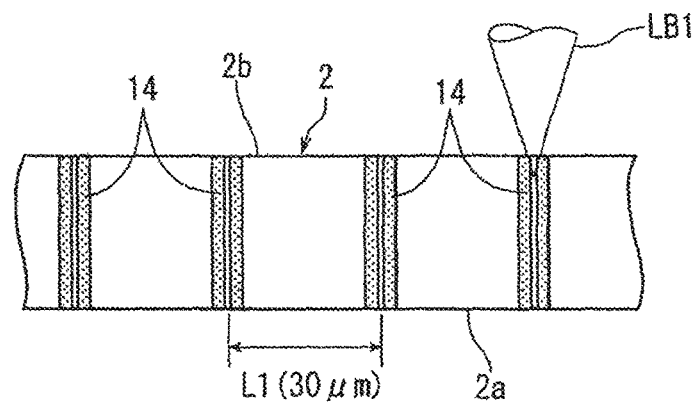
FIG. 3A is a fragmentary cross-sectional view of the wafer with shield tunnels formed therein.
Figure 3B:
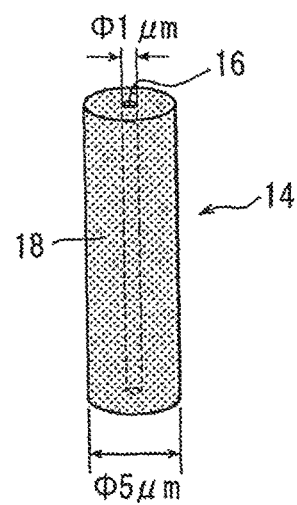
FIG. 3B is an enlarged perspective view of a shield tunnel.

When the shield tunnel forming step is carried out on the wafer 2, as depicted in FIG. 3A, a plurality of shield tunnels 14 extending from the reverse side 2b to the face side 2a of the wafer 2 are formed in the wafer 2 along the projected dicing lines 4 at predetermined spaced intervals L1. As depicted in FIG. 3B, each of the shield tunnels 14 is made up of a pore 16 having a diameter of approximately 1 μm and an amorphous body 18 having a diameter of approximately 5 μm and surrounding the pore 16. Inasmuch as the processing-feed rate, denoted V1 below, of the chuck table is 300 mm/second and the repetitive frequency, denoted F1 below, of the pulsed laser beam LB1 is 10 kHz, each of the spaced intervals L1 between the shield tunnels 14 along the projected dicing lines 4 is given as:

$$L1 = V1/F1$$
$$= 300 \text{ mm/second} \div 10 \text{ kHz}$$
$$= 30 \text{ μm}$$

Therefore, since the distances between the adjacent shield tunnels 14 are large enough, a previously formed shield tunnel 14 does not scatter a subsequently applied pulsed laser beam LB1 and hence the light-emitting layer is not damaged by the pulsed laser beam LB1.

The shield tunnel forming step is followed by a modified layer forming step to apply a pulsed laser beam having a wavelength that is transmittable through the sapphire substrate to the wafer 2 while positioning the focused spot of the pulsed laser beam in the projected dicing lines 4 through the reverse side 2b of the wafer 2, thereby forming modified layers in the predetermined spaced intervals between the shield tunnels 14. The modified layer forming step may be performed using a second laser processing apparatus 20, partly depicted in FIG. 4. The second laser processing apparatus 20 includes a chuck table, not depicted, for holding a workpiece, i.e., the wafer 2, thereon, a condenser 22 for applying a pulsed laser beam LB2 to the wafer 2 held on the chuck table, and image capturing means, not depicted, for capturing an image of the wafer 2 held on the chuck table. The chuck table, which is arranged to hold the wafer 2 under suction on its upper surface, is rotatable about a vertical axis thereof by rotating means and is movable forwards and backwards along an X direction by X-direction moving means, not depicted, and also movable forwards and backwards along a Y direction by Y-direction moving means, not depicted. The condenser 22 includes a condensing lens, not depicted, for focusing the pulsed laser beam LB2, which is oscillated by a pulsed laser oscillator, not depicted, of the second laser processing apparatus 20 and applying the focused pulsed laser beam LB2 to the wafer 2. The image capturing means includes an ordinary imaging device (CCD) for capturing images of the wafer 2 with a visible light beam, infrared radiation applying means for applying an infrared radiation to the wafer 2, an optical system for capturing the infrared radiation emitted from the infrared radiation applying means, and an imaging device (infrared CCD) for outputting an electric signal representing the infrared radiation captured by the optical system, all not depicted. The X direction referred to above is a direction indicated by the arrow X in FIG. 4, whereas the Y direction referred to above is a direction indicated by the arrow Y in FIG. 4 and extending perpendicularly to the X direction. An XY plane that is defined by the X direction and the Y direction, i.e., that contains the X direction and the Y direction, lies essentially horizontally.

Figure 4:
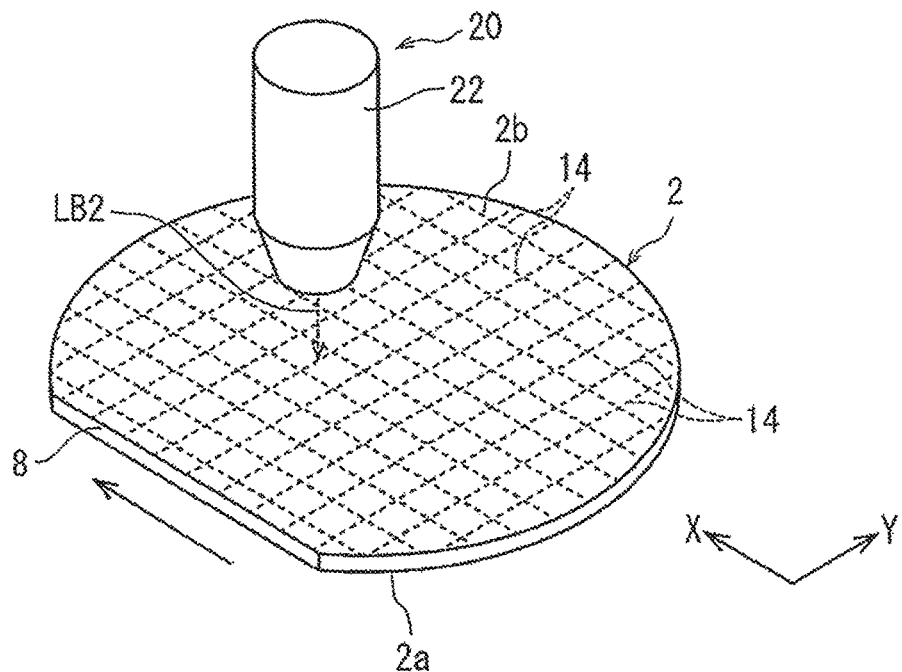
FIG. 4 is a perspective view illustrative of the manner in which a modified layer forming step is carried out on the wafer.

Continuously referring to FIG. 4, in the modified layer forming step, the wafer 2 with its reverse side 2b directed upwardly is attracted under suction to the upper surface of the chuck table of the second laser processing apparatus 20. Then, the image capturing means, not depicted, of the second laser processing apparatus 20 captures an image of the wafer 2 from above. Thereafter, the X-direction moving means, the Y-direction moving means, and the rotating means of the second laser processing apparatus 20 move and rotate the chuck table to adjust the orientation of the wafer 2 to a predetermined orientation and also adjust the relative position of the wafer 2 and the condenser 22 over the XY plane based on the image of the wafer 2 captured by the image capturing means. For adjusting the orientation of the wafer 2, the orientation flat 8 is aligned with the X direction, as depicted in FIG. 4, thereby aligning the first projected dicing lines 4a with the X direction and aligning the second projected dicing lines 4b with the Y direction. For adjusting the relative position of the wafer 2 and the condenser 22 over the XY plane, the condenser 22 is positioned above an end of one of the first projected dicing lines 4a aligned with the X direction. At this time, the reverse side 2b of the wafer 2 is directed upwardly and the face side 2a of the wafer 2 on which the projected dicing lines 4 are formed is directed downwardly. Since, as is the case with the image capturing means of the first laser processing apparatus 10, the image capturing means of the second laser processing apparatus 20 includes the infrared radiation applying means, the optical system for capturing the infrared radiation, and the imaging device (infrared CCD) for outputting the electric signal representing the infrared radiation, the image capturing means is able to capture the projected dicing lines 4 on the face side 2a through the reverse side 2b of the wafer 2. Consequently, the condenser 22 can be positioned above the end of one of the first projected dicing lines 4a based on the image captured by the image capturing means.

Then, focused spot position adjusting means, not depicted, of the second laser processing apparatus 20 moves the condenser 22 along an optical axis thereof to position the focused spot of the pulsed laser beam LB2 in an area within the wafer 2 which corresponds to one of the first projected dicing lines 4a through the reverse side 2b of the wafer 2. Then, the modified layer forming step is performed in which while the wafer 2 and the focused spot are being relatively moved in the X direction, the condenser 22 applies the pulsed laser beam LB2, which has a wavelength that is transmittable through the sapphire substrate, to the wafer 2. According to the present embodiment, in the modified layer forming step, the focused spot is not moved, but the chuck table is processing-fed in the X direction at a predetermined processing-feed rate with respect to the focused spot by the X-direction moving means. Thereafter, the wafer 2 and the focused spot are relatively indexing-fed in the Y direction by a distance commensurate with each of the spaced intervals between the first projected dicing lines 4a. According to the present embodiment, in such an indexing-feed process, the focused spot is not moved, but the chuck table is indexing-fed by the distance commensurate with each of the spaced intervals between the first projected dicing lines 4a, in the Y direction with respect to the focused spot by the Y-direction moving means. The modified layer forming step and the indexing-feed process are alternately repeated to perform the modified layer forming step along all the first projected dicing lines 4a that have been aligned with the X direction. Thereafter, the rotating means rotates the chuck table through 90 degrees, and the modified layer forming step and an indexing-feed process for relatively indexing-feeding the wafer 2 and the focused spot in the Y direction by a distance commensurate with each of the spaced intervals between the second projected dicing lines 4b are alternately repeated to perform the modified layer forming step along all the second projected dicing lines 4b. The modified layer forming step described above may be carried out under the conditions described below, for example.

| | |
|---|---|
| Pulsed laser beam wavelength | 1030 nm |
| Pulse duration | 10 ps |
| Repetitive frequency | 100 kHz |
| Condensing lens numerical aperture (NA) | 0.8 |
| Average power output | 0.5 W |
| Defocus | −250 μm |
| Focused spot diameter | 5 μm |
| Processing-feed rate | 1000 mm/second |

Figure 5:
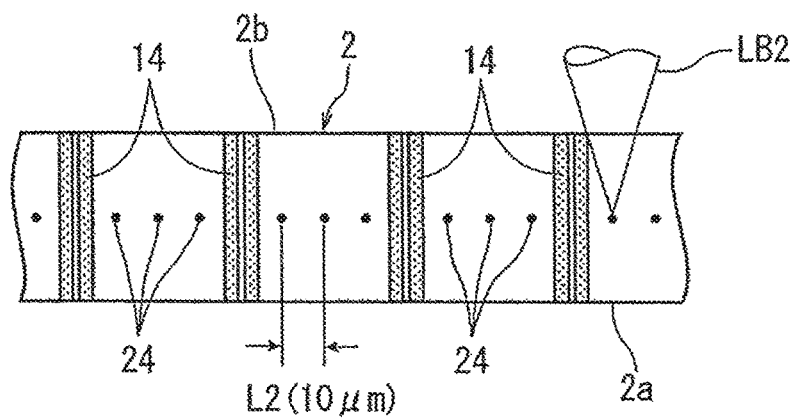
FIG. 5 is a fragmentary cross-sectional view of the wafer with modified layers formed therein.

When the modified layer forming step is carried out on the wafer 2, as depicted in FIG. 5, a plurality of modified layers 24 are formed in the predetermined spaced intervals L1 between the shield tunnels 14 in the wafer 2. The shield tunnels 14 and the modified layers 24 serve as division triggering points along the projected dicing lines 4. Adjacent ones of the division triggering points along the projected dicing lines 4 are spaced at intervals L2 from each other. Inasmuch as the processing-feed rate, denoted V2 below, of the chuck table is 1000 mm/second and the repetitive frequency, denoted F2 below, of the pulsed laser beam LB2 is 100 kHz, each of the spaced intervals L2 between the modified layers 24 along the projected dicing lines 4 is given as:

$$L2 = V2/F2$$
$$= 1000 \text{ mm/second} \div 100 \text{ kHz}$$
$$= 10 \text{ μm}$$

Under the above conditions, three modified layers 24 are formed in each of the intervals L1.

Figure 6:
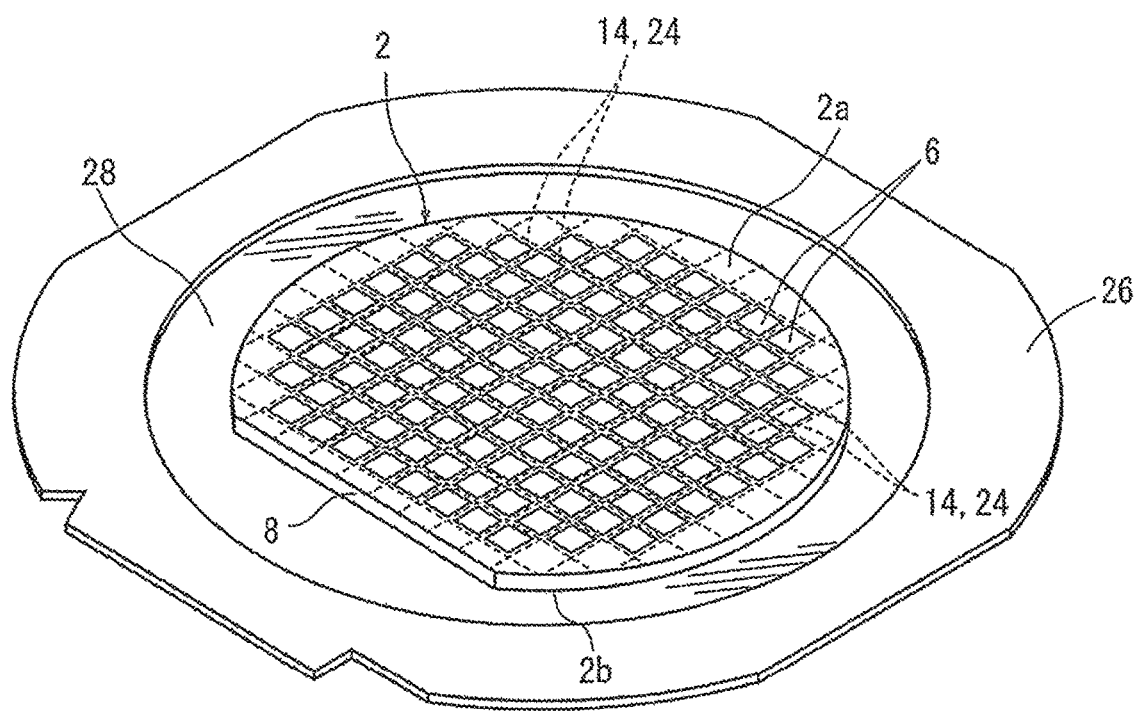
FIG. 6 is a perspective view of the wafer that is mounted on an annular frame by an adhesive tape.
Figure 7A:
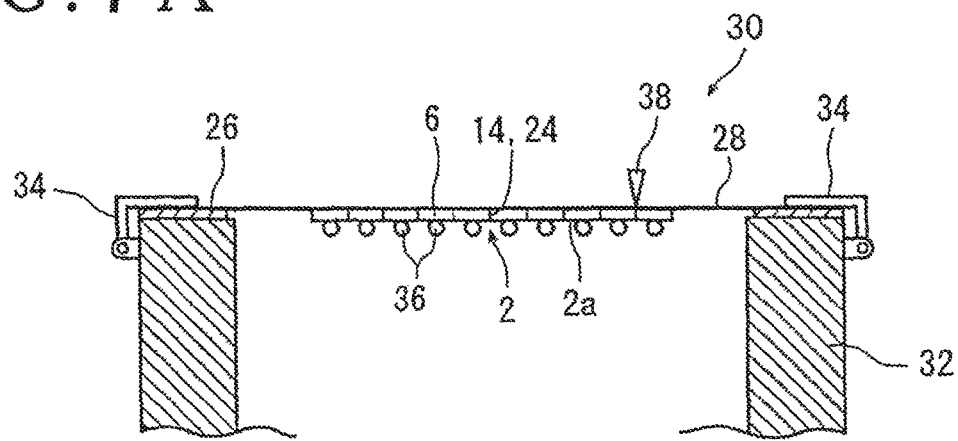
FIG. 7A is a cross-sectional view illustrative of the manner in which a dividing step is carried out on the wafer.
Figure 7B:
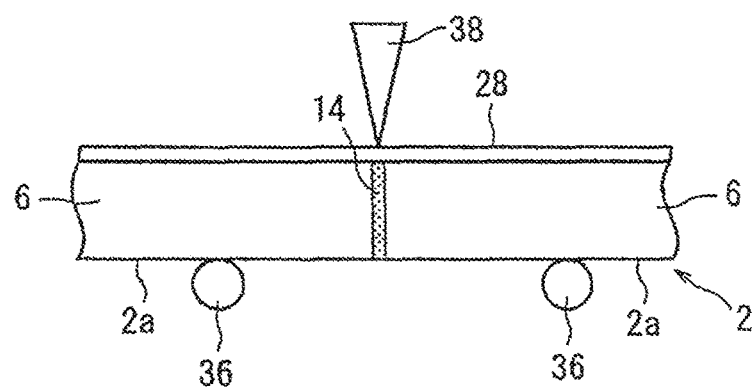
FIG. 7B is an enlarged fragmentary cross-sectional view of a portion of the wafer depicted in FIG. 7A.

The modified layer forming step is followed by a dividing step to apply external forces to the wafer 2 to divide the wafer 2 into individual optical devices 6. The dividing step may be carried out on the wafer 2 which, as depicted in FIG. 6, has its face side 2a directed upwardly and is applied to an adhesive tape 28 whose peripheral edge is fixed to an annular frame 26, using a dividing apparatus 30 partly depicted in FIG. 7A. As depicted in FIG. 7A, the dividing apparatus 30 includes a hollow cylindrical base 32 extending vertically, a plurality of clamps 34 mounted on an outer circumferential surface of an upper end portion of the base 32 and spaced circumferentially around the base 32, a plurality of cylindrical support rods 36 disposed parallel to each other radially inwardly of the base 32, and a presser 38 for pressing a workplace, i.e., the wafer 2, placed on the support rods 36. The presser 38 extends parallel to the support rods 36. As depicted in FIG. 7B, the presser 38 has a triangular cross-sectional shape whose width is progressively smaller in a downward direction.

Figure 7C:
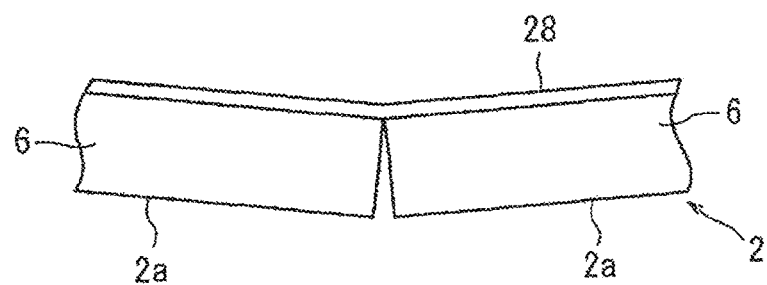
FIG. 7C is an enlarged fragmentary cross-sectional view of the wafer being divided.
Figure 8:
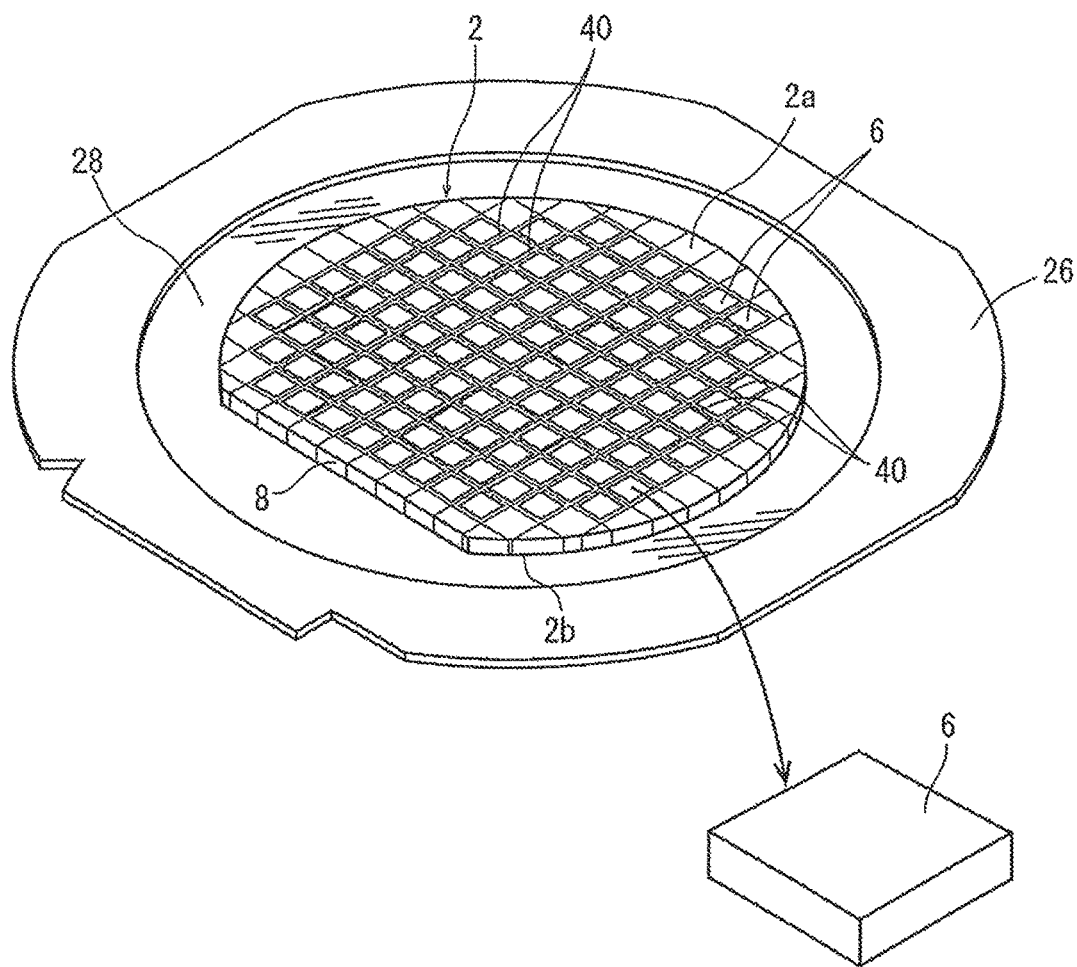
FIG. 8 is a perspective view depicting the wafer that has been divided into individual optical device chips along projected dicing lines on the wafer.

The dividing step will be described below with reference to FIGS. 7A through 7C. First, the annular frame 26 is placed on an upper surface of the base 32 with the adhesive tape 28 side facing upwardly and the first projected dicing lines 4a positioned between the support rods 36. Then, the annular frame 26 has its outer peripheral edge portion fixed to the upper surface of the base 32 by the clamps 34. Then, as depicted in FIG. 7B, the presser 38 presses the wafer 2 from the adhesive tape 28 side along one of the first projected dicing lines 4a. As depicted in FIG. 7C, the wafer 2 is now divided along the first projected dicing line 4a from division triggering points that are provided by the shield tunnel 14 and the modified layers 24 which are formed along the first projected dicing line 4a. The presser 38 is then lifted and moved laterally by a distance commensurate with the interval between adjacent first projected dicing lines 4a, and presses the wafer 2 along a next first projected dicing line 4a, dividing the wafer 2. The above process is repeated to divide the wafer 2 along all the first projected dicing lines 4a. Thereafter, the clamps 34 are operated to release the annular frame 26 from the upper surface of the base 32, and the annular frame 26 is then turned 90 degrees to position the second projected dicing lines 4b between the support rods 36. The annular frame 26 is then placed on the upper surface of the base 32, and has its outer peripheral edge portion fixed to the upper surface of the base 32 by the clamps 34. Then, the presser 38 presses the wafer 2 from the adhesive tape 28 side along one of the second projected dicing lines 4b. The wafer 2 is now divided along the second projected dicing line 4b from division triggering points that are provided by the shield tunnel 14 and the modified layers 24 which are formed along the second projected dicing line 4b. The presser 38 is then lifted and moved laterally by a distance commensurate with the interval between adjacent second projected dicing lines 4b, and presses the wafer 2 along a next second projected dicing line 4b, dividing the wafer 2. The above process is repeated to divide the wafer 2 along all the second projected dicing lines 4b. In this manner, as depicted in FIG. 8, the wafer 2 has been divided into a plurality of chips with the optical devices 6 formed individually on their surfaces. FIG. 8 depicts divided lines 40 along which the wafer 2 has been divided along the projected dicing lines 4 where the division triggering points are present.

According to the present embodiment, as described above, the shield tunnel forming step and the modified layer forming step are carried out to form vertical division triggering points from the reverse side 2b to the face side 2a of the wafer 2 by means of the shield tunnels 14, and also to form division triggering points along the projected dicing lines 4 by means of the modified layers 24 formed between the shield tunnels 14. When the wafer 2 is then divided into individual optical device chips in the dividing step, the optical device chips have side surfaces as vertical surfaces extending from the face side 2a to the reverse side 2b of the wafer 2 and along the projected dicing lines 4. According to the present embodiment, therefore, since no ablation process is performed, the method of processing a wafer is free of the problem of a reduction in the quality of optical devices on the wafer 2 due to scattered debris produced by an ablation process. The method of processing at wafer is also free of the problem of failing to form vertical side walls on optical device chips because the wafer 2 tends to be obliquely divided from its face side 2a to its reverse side 2b in a process of continuously forming modified layers in the wafer 2 and applying external forces to divide the wafer 2 into individual optical device chips, and the problem of damaging a light-emitting layer on the face side 2a of the wafer 2 due to a subsequently applied laser beam scattered by a plurality of shield tunnels that are continuously formed in the wafer.

In the present embodiment, the modified layer forming step is illustrated as being carried out after the shield tunnel forming step is carried out. However, the shield tunnel forming step may be carried out after the modified layer forming step is carried out. In the present embodiment, the wafer 2 is illustrated as being applied to the adhesive tape 28 fixed to the annular frame 26 in preparation for the dividing step. However, the shield tunnel forming step and the modified layer forming step may be carried out on the wafer 2 that has its reverse side 2b directed upwardly and which is applied to the adhesive tape 28 fixed to the annular frame 26. In the present embodiment, moreover, the dividing step is illustrated as being performed using the dividing apparatus 30. However, the dividing step may be carried out to divide the wafer 2 into individual optical device chips along the projected dicing lines 4 with the shield tunnels 14 and the modified layers 24 formed in the wafer 2 therealong, using expanding means that expands the adhesive tape 28 to which the wafer 2 is applied, exerting radial tensile forces to the wafer 2.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A method of processing a wafer to divide the wafer into individual optical device chips, the wafer including a sapphire substrate with a light-emitting layer deposited on a face side thereof and demarcated by a grid of intersecting projected dicing lines into a plurality of areas with optical devices disposed individually therein, the method comprising:
   a shield tunnel forming step of applying a pulsed laser beam having a wavelength that is transmittable through the sapphire substrate to the wafer while positioning a focused spot of the pulsed laser beam within the wafer in regions corresponding to the projected dicing lines through a reverse side of the wafer, thereby forming a plurality shield tunnels each made up of a pore and an amorphous body surrounding the pore, at predetermined spaced intervals in the wafer along the projected dicing lines;
   a modified layer forming step of applying a pulsed laser beam having a wavelength that is transmittable through the sapphire substrate to the wafer while positioning a focused spot of the pulsed laser beam within the wafer in the projected dicing lines through the reverse side of the wafer, thereby forming modified layers between adjacent ones of the shield tunnels; and
   a dividing step of exerting external forces to the wafer to divide the wafer into a plurality of optical device chips.

* * * * *